(12) United States Patent
Onoue et al.

(10) Patent No.: US 9,740,091 B2
(45) Date of Patent: Aug. 22, 2017

(54) SUBSTRATE WITH MULTILAYER REFLECTIVE FILM, REFLECTIVE MASK BLANK FOR EUV LITHOGRAPHY, REFLECTIVE MASK FOR EUV LITHOGRAPHY, AND METHOD OF MANUFACTURING THE SAME, AND METHOD OF MANUFACTURING A SEMICONDUCTOR DEVICE

(71) Applicant: HOYA CORPORATION, Tokyo (JP)

(72) Inventors: Takahiro Onoue, Tokyo (JP); Hirofumi Kozakai, Tokyo (JP)

(73) Assignee: HOYA CORPORATION, Tokyo (JP)

(*) Notice: Subject to any disclaimer, the term of this patent is extended or adjusted under 35 U.S.C. 154(b) by 84 days.

(21) Appl. No.: 14/906,288

(22) PCT Filed: Jul. 15, 2014

(86) PCT No.: PCT/JP2014/068762
§ 371 (c)(1),
(2) Date: Jan. 20, 2016

(87) PCT Pub. No.: WO2015/012151
PCT Pub. Date: Jan. 29, 2015

(65) Prior Publication Data
US 2016/0147139 A1 May 26, 2016

(30) Foreign Application Priority Data

Jul. 22, 2013 (JP) .................................. 2013-151618

(51) Int. Cl.
*G03F 1/24* (2012.01)
*G03F 1/48* (2012.01)
*G03F 1/76* (2012.01)
*G03F 7/20* (2006.01)

(52) U.S. Cl.
CPC .................. *G03F 1/24* (2013.01); *G03F 1/48* (2013.01); *G03F 1/76* (2013.01); *G03F 7/2004* (2013.01)

(58) Field of Classification Search
None
See application file for complete search history.

(56) References Cited

U.S. PATENT DOCUMENTS

| 8,580,465 B2 | 11/2013 | Mikami et al. |
| 8,828,626 B2 | 9/2014 | Mikami et al. |

(Continued)

FOREIGN PATENT DOCUMENTS

| EP | 2 511 945 A1 | 10/2012 |
| JP | 2002-122981 A | 4/2002 |

(Continued)

OTHER PUBLICATIONS

International Search Report for PCT/JP2014/068762 dated Oct. 21, 2014.

*Primary Examiner* — Stephen Rosasco
(74) *Attorney, Agent, or Firm* — Sughrue Mion, PLLC

(57) ABSTRACT

An object of the present invention is to provide a substrate with a multilayer reflective film, which gives a reflective mask achieving high reflectance and exhibiting excellent cleaning resistance. The present invention is directed to a substrate with a multilayer reflective film, which has: a substrate; a multilayer reflective film, formed on the substrate, comprising a layer that includes Si as a high refractive-index material and a layer that include a low refractive-index material, the layers being periodically laminated; a Ru protective film, formed on the multilayer reflective film, for protecting the multilayer reflective film; and a block layer, formed between the multilayer reflective film and the Ru protective film, for preventing the migration of Si to the Ru protective film, wherein the surface layer of the multilayer (Continued)

reflective film opposite from the substrate is the layer comprising Si, and at least part of the Si is diffused into the block layer.

14 Claims, 3 Drawing Sheets

(56) References Cited

U.S. PATENT DOCUMENTS

| | | |
|---|---|---|
| 2002/0045108 A1 | 4/2002 | Lee et al. |
| 2006/0270226 A1 | 11/2006 | Hosoya |
| 2012/0219890 A1 | 8/2012 | Mikami |
| 2012/0225375 A1 | 9/2012 | Mikami |
| 2012/0231378 A1 | 9/2012 | Mikami et al. |
| 2013/0115547 A1 | 5/2013 | Mikami et al. |

FOREIGN PATENT DOCUMENTS

| | | |
|---|---|---|
| JP | 2003-133205 A | 5/2003 |
| JP | 2006-332153 A | 12/2006 |
| JP | 2008-16821 A | 1/2008 |
| JP | 2010-118520 A | 5/2010 |
| JP | 2011-181657 A | 9/2011 |
| JP | 2013-74268 A | 4/2013 |
| WO | 2011/068223 A1 | 6/2011 |
| WO | 2011/071086 A1 | 6/2011 |
| WO | 2011/071123 A1 | 6/2011 |
| WO | 2011/071126 A1 | 6/2011 |
| WO | 2012/014904 A1 | 2/2012 |

SUBSTRATE WITH MULTILAYER REFLECTIVE FILM, REFLECTIVE MASK BLANK FOR EUV LITHOGRAPHY, REFLECTIVE MASK FOR EUV LITHOGRAPHY, AND METHOD OF MANUFACTURING THE SAME, AND METHOD OF MANUFACTURING A SEMICONDUCTOR DEVICE

CROSS REFERENCE TO RELATED APPLICATIONS

This application is a National Stage of International Application No. PCT/JP2014/068762 filed Jul. 15, 2014, claiming priority based on Japanese Patent Application No. 2013-151618 filed Jul. 22, 2013, the contents of all of which are incorporated herein by reference in their entirety.

FIELD OF THE INVENTION

The present invention relates to a substrate with a multilayer reflective film, which is an original form for manufacturing a mask for exposure used in, for example, manufacturing a semiconductor device, a reflective mask blank for EUV lithography, a reflective mask for EUV lithography, and a method of manufacturing the same as well as a method of manufacturing a semiconductor device.

BACKGROUND ART

As demands for VLSI devices having higher density and improved precision are further increasing in recent years, EUV lithography, which is an exposure technique using an extreme ultraviolet (hereinafter, referred to as "EUV") light, is considered promising. EUV light indicates light in a wavelength range of a soft X-ray region or a vacuum ultraviolet region, specifically, light having a wavelength of about 0.2 to 100 nm.

A reflective mask used in such lithography has formed on, e.g., a glass or silicon substrate a multilayer reflective film for reflecting an exposure light, wherein the multilayer reflective film has formed therein a pattern of an absorber film for absorbing an exposure light. In an exposure machine for performing pattern transfer, light striking the reflective mask mounted on the exposure machine is absorbed by portions of the multilayer reflective film having the absorber film pattern and reflected by portions of the multilayer reflective film having no absorber film pattern. Then, the reflected light image is transferred through a reflection optical system onto a semiconductor substrate, such as a silicon wafer.

For achieving a semiconductor device having an increased density and improved precision using the above reflective mask, the reflective region in the reflective mask (the surface of the multilayer reflective film) is required to have a high reflectance with respect to an EUV light which is an exposure light.

The above-described multilayer reflective film is a multilayer film comprising elements having different refractive indices, which are periodically laminated, and, generally, a multilayer film is used in which a thin film of a heavy element or a compound thereof and a thin film of a light element or a compound thereof are alternately laminated in about 40 to 60 cycles of the layers. For example, as a multilayer reflective film for an EUV light having a wavelength of 13 to 14 nm, a Mo/Si periodically laminated film in which a Mo film and a Si film are alternately laminated in about 40 cycles of the layers is preferably used. Mo is easily oxidized in air which decreases the reflectance of the multilayer reflective film, and therefore the Si film constitutes the uppermost layer of the multilayer reflective film.

As a reflective mask used in the EUV lithography, for example, there is a reflective mask for exposure described in Patent Document 1 below. Specifically, Patent Document 1 has proposed a reflective photomask characterized by having: a substrate; a reflective layer, formed on the substrate, comprising a multilayer film in which two different films are alternately laminated; a buffer layer, formed on the reflective layer, comprising a ruthenium film; and an absorber pattern, formed on the buffer layer so as to have a predetermined pattern form, comprising a material capable of absorbing soft X-rays.

The above-described buffer layer is also called a protective film. When forming the absorber pattern, a part of the absorber film is etched through a resist, and, to ensure the formation of the absorber pattern, the absorber film is subjected to slight over etching, and therefore the film present under the absorber film is inevitably etched. In this instance, to prevent the multilayer reflective film under the absorber film from suffering a damage, a protective film is formed.

With respect to the protective film, further, from the viewpoint of suppressing the formation of a diffused layer (which leads to a reduction of the reflectance of the multilayer reflective film) between the Si layer constituting the surface layer of the multilayer reflective film and the protective film, a protective film comprising a Ru alloy having Zr or B added to Ru has been proposed (Patent Document 2).

Further, for solving a problem that, in the steps conducted when manufacturing a mask blank or a mirror or in the steps conducted when manufacturing a photomask from the mask blank (for example, cleaning, defect inspection, heating step, dry etching, and defect correction steps), or in the EUV exposure, the protective film and further the uppermost layer of the multilayer reflective film (Si layer in the case of a Mo/Si multilayer reflective film) are oxidized and reduce the EUV light reflectance, the formation of an intermediate layer containing Si and O in predetermined amounts between the Mo/Si multilayer reflective film and the Ru protective film has been proposed (Patent Document 3).

Patent Document 4 discloses a reflective mask blank having: a substrate; a multilayer reflective film, formed on the substrate, to reflect an exposure light; a protective film, formed on the multilayer reflective film, to protect the multilayer reflective film; and an absorber film, formed on the protective film, to absorb an exposure light, the reflective mask blank being characterized in that the protective film comprises ruthenium (Ru), or a ruthenium compound containing ruthenium (Ru) and at least one member selected from molybdenum (Mo), niobium (Nb), zirconium (Zr), yttrium (Y), boron (B), titanium (Ti), and lanthanum (La), wherein a thermal diffusion suppressing film comprising a material having a refractive index (n) of more than 0.90 and having a linear attenuation coefficient (k) of less than −0.020 is formed between the multilayer reflective film and the protective film.

The above documents further indicate that the multilayer reflective film may be subjected to heat treatment at 50 to 150° C., for example, to reduce the film stress of the multilayer reflective film, and that, in the working Examples, the multilayer reflective film was subjected to such heat treatment. Afterwards, the individual interfaces between the Si film as the uppermost layer of the multilayer reflective film, the thermal diffusion suppressing film, and the RuNb protective film were examined by means of a transmission electron microscope, and, as a result, a diffused layer was not confirmed in any of the interfaces.

PRIOR ART REFERENCES

Patent Documents

Patent Document 1: JP 2002-122981A
Patent Document 2: JP 2008-016821A
Patent Document 3: WO2011/068223 pamphlet
Patent Document 4: JP 2006-332153A

SUMMARY OF THE INVENTION

Problems to be Solved by the Invention

In manufacturing a semiconductor device utilizing EUV lithography, the lithography is performed in a high vacuum, and impurities, such as carbon, may be deposited on the above-described reflective mask when being irradiated with an EUV light or after being irradiated with an EUV light. For this reason, after the lithography, the resultant reflective mask must be cleaned. Further, generally, the reflective mask is repeatedly used, and therefore cleaning for the mask is repeatedly conducted.

For this reason, the reflective mask is required to have a satisfactory cleaning resistance. The protective film is formed on a portion of the reflective mask in which the absorber film pattern is not formed, and therefore both the absorber film pattern and the protective film are required to have a cleaning resistance.

However, according to the studies conducted by the present inventor, it has been found that, with respect to the reflective mask having the conventional configuration disclosed in Patent Documents 1 to 4 above, when cleaning for the mask according to general RCA cleaning is conducted a plurality of times, stripping of the Ru protective film on the multilayer reflective film in the exposed reflective region occurs. The reason for this is as follows. Specifically, in the configuration in Patent Documents 1 and 2, Si migrates from the Si layer in the multilayer reflective film toward the Ru protective film and diffuses through the grain boundary in the Ru protective film with the passage of time (and then forms Ru silicide (RuSi)), and reaches the surface layer of the Ru protective film and suffers oxidation reaction due to a cleaning agent or gas to form $SiO_2$, or, when the protective film is not dense, a cleaning agent or gas penetrates the protective film, so that $SiO_2$ is formed within the protective film. The adhesion between Ru and $SiO_2$ is poor so that these are separated to cause stripping.

Also in the configuration in Patent Documents 3 and 4, it is considered that the adhesion between the intermediate layer (thermal diffusion suppressing film) and the Ru protective film is poor or unsatisfactory so that the repeated cleaning causes the Ru protective film to suffer stripping.

The occurrence of the above-described stripping of film causes further dust or causes the reflectance to be non-uniform, and, in such a case, there is a danger that, upon transferring a pattern onto a semiconductor substrate, the pattern cannot be accurately transferred, and this is a serious problem.

Accordingly, the first object of the present invention is to provide a substrate with a multilayer reflective film, which gives a reflective mask achieving high reflectance and exhibiting excellent cleaning resistance, and the second object is to provide a reflective mask blank for EUV lithography manufactured using the above substrate with a multilayer reflective film, for example, a reflective mask for EUV lithography obtained from the mask blank and a method of manufacturing the same, and a method of manufacturing a semiconductor device using the reflective mask.

Means to Solve the Problems

The present inventor has made studies with a view toward solving the above-described problems, and thought that it is difficult to prevent Si from coming in contact with gas or a cleaning agent to be oxidized to form $SiO_2$, and therefore it is the most important to suppress the diffusion of Si into the Ru protective film.

As a result of the studies actually made, it has been found that when a block layer for suppressing the diffusion of Si into the Ru protective film is formed between the multilayer reflective film and the Ru protective film so that at least part of Si, which constitutes the surface layer of the multilayer reflective film opposite from the substrate, is diffused into the block layer, there can be obtained a reflective mask for EUV lithography in which stripping of the Ru protective film is suppressed and resistance to the repeated cleaning is satisfactory. Thus, the present invention has been completed.

Specifically, for solving the above-described problems, the present invention has the following configurations.

(Configuration 1)

A substrate with a multilayer reflective film, having: a substrate, a multilayer reflective film, formed on the substrate, comprising a layer that includes Si as a high refractive-index material and a layer that include a low refractive-index material, the layers being periodically laminated; a Ru protective film, formed on the multilayer reflective film, for protecting the multilayer reflective film; and a block layer, formed between the multilayer reflective film and the Ru protective film, for preventing the migration of Si to the Ru protective film, wherein the surface layer on the other side of the multilayer reflective film opposite from the substrate is the layer comprising Si, and at least part of the Si is diffused into the block layer.

As described in Configuration 1 above, in the substrate with a multilayer reflective film having a multilayer reflective film using Si as a high refractive-index material, by employing a configuration in which the top surface of the multilayer reflective film is the layer comprising Si and a Ru protective film is formed on the layer, and further a block layer for preventing the migration of Si to the Ru protective film is formed between the multilayer reflective film and the Ru protective film wherein Si is diffused into the block layer, the migration of Si to the Ru protective film is prevented, suppressing the formation of a silicon oxide (such as $SiO_2$). Thus, there can be obtained a substrate with a multilayer reflective film, which is an original form for manufacturing a reflective mask for EUV lithography having excellent cleaning resistance.

(Configuration 2)

The substrate with a multilayer reflective film according to Configuration 1, wherein the block layer comprises at least one member selected from the group consisting of at least one metal selected from Ti, Al, Ni, Pt, Pd, W, Mo, Co, and Cu and an alloy of the above two or more metals, and a nitride, a silicide, and a silicide nitride thereof.

As described in Configuration 2 above, the block layer preferably comprises, specifically, at least one member selected from the group consisting of at least one metal selected from Ti, Al, Ni, Pt, Pd, W, Mo, Co, and Cu and an alloy of the above two or more metals, and a nitride, a silicide, and a silicide nitride thereof.

(Configuration 3)

The substrate with a multilayer reflective film according to Configuration 2, wherein a gradient region in which the content of the metal component constituting the block layer continually decreases toward the substrate is present between the layer comprising Si, which is the surface layer of the multilayer reflective film opposite from the substrate, and the block layer.

As described in Configuration 3 above, when a gradient region in which the content of the metal component constituting the block layer continuously decreases toward the substrate is present between the layer comprising Si, which constitutes the top surface layer of the multilayer reflective film, and the block layer, a reflective mask obtained from the substrate with a multilayer reflective film is advantageously further improved in the cleaning resistance.

(Configuration 4)

The substrate with a multilayer reflective film according to any one of Configurations 1 to 3, wherein the low refractive-index material is Mo.

As described in Configuration 4 above, for achieving excellent reflectance for an EUV light, in the layer comprising the low refractive-index material constituting the multilayer reflective film, Mo is preferred as the low refractive-index material.

(Configuration 5)

The substrate with a multilayer reflective film according to any one of Configurations 1 to 4, wherein the block layer has a thickness of 0.2 to 2.0 nm.

As described in Configuration 5 above, the block layer preferably has a thickness of 0.2 to 2.0 nm because the block layer may slightly lower the reflectance of the multilayer reflective film.

(Configuration 6)

The substrate with a multilayer reflective film according to any one of Configurations 1 to 5, wherein the block layer comprises at least one member selected from the group consisting of titanium (Ti), a titanium nitride ($TiN_x$ ($x>0$)), a titanium silicide ($TiSi_x$ ($x>0$)), and a titanium silicide nitride ($Ti_xSi_yN_z$ ($x>0, y>0, z>0$)).

As described in Configuration 6 above, from the viewpoint of achieving a reflective mask for EUV lithography having excellent cleaning resistance, the block layer preferably comprises at least one member selected from the group consisting of titanium (Ti), a titanium nitride ($TiN_x$ ($x>0$)), a titanium silicide ($TiSi_x$ ($x>0$)), and a titanium silicide nitride ($Ti_xSi_yN_z$($x>0, y>0, z>0$)).

(Configuration 7)

A reflective mask blank for EUV lithography, having the substrate with a multilayer reflective film according to any one of Configurations 1 to 6, and an absorber film, formed on the Ru protective film in the substrate with a multilayer reflective film, for absorbing an EUV light.

As described in Configuration 7 above, the reflective mask blank for EUV lithography of the present invention has a configuration having, on a Ru protective film in the substrate with a multilayer reflective film of the present invention, an absorber film for absorbing an EUV light. By virtue of Configuration 7 above, there can be obtained a reflective mask blank for EUV lithography, which is an original form for manufacturing a reflective mask for EUV lithography achieving high reflectance and exhibiting excellent cleaning resistance.

(Configuration 8)

The reflective mask blank for EUV lithography according to Configuration 7, further comprising a resist film on the absorber film.

As described in Configuration 8 above, the reflective mask blank for EUV lithography of the present invention includes an embodiment further having a resist film on the absorber film.

(Configuration 9)

A method of manufacturing a substrate with a multilayer reflective film, which has: a substrate; a multilayer reflective film, formed on the substrate, comprising a layer that includes Si as a high refractive-index material and a layer that include a low refractive-index material, the layers being periodically laminated; a Ru protective film, formed on the multilayer reflective film, for protecting the multilayer reflective film; and a block layer, formed between the multilayer reflective film and the Ru protective film, for preventing the migration of Si to the Ru protective film, wherein the surface layer of the multilayer reflective film opposite from the substrate is the layer comprising Si, and at least part of the Si is diffused into the block layer, the method having the steps of:

forming the multilayer reflective film on the substrate;

forming, on the layer comprising Si, which is the surface layer of the multilayer reflective film opposite from the substrate, a block layer for preventing the migration of Si to the Ru protective film; and forming the Ru protective film on the block layer, the method further comprising the step of, after forming the block layer, subjecting the resultant substrate to heat treatment under temperature conditions wherein at least part of the Si in the multilayer reflective film is diffused into the block layer.

By the method of manufacturing a substrate with a multilayer reflective film described in Configuration 9 above, as obtained in Configuration 3 above, there can be obtained a substrate with a multilayer reflective film, which is an original form for manufacturing a reflective mask for EUV lithography achieving high reflectance and exhibiting excellent cleaning resistance.

(Configuration 10)

A method of manufacturing a reflective mask blank for EUV lithography, having a step of forming an absorber film on the Ru protective film in the substrate with a multilayer reflective film obtained by the method of manufacturing the substrate with a multilayer reflective film according to Configuration 9.

As described in Configuration 10 above, the reflective mask blank for EUV lithography of the present invention can be manufactured by forming, on a Ru protective film in the substrate with a multilayer reflective film of the present invention, an absorber film for absorbing an EUV light. The reflective mask blank can be used as an original form for manufacturing a reflective mask for EUV lithography achieving high reflectance and exhibiting excellent cleaning resistance.

(Configuration 11)

A method of manufacturing a reflective mask for EUV lithography, having a step of patterning an absorber film in the reflective mask blank for EUV lithography according to claim 8 with the resist film to form an absorber film pattern on the Ru protective film.

As described in Configuration 11 above, by patterning an absorber film in the reflective mask blank for EUV lithography of the present invention with the resist film, an absorber film pattern is formed on the Ru protective film, and thus, by performing the above step, the reflective mask for EUV lithography of the present invention having excellent cleaning resistance can be obtained.

(Configuration 12)

A reflective mask for EUV lithography, having the substrate with a multilayer reflective film according to any one of Configurations 1 to 6, and an absorber film pattern, formed on the Ru protective film in the substrate with a multilayer reflective film, for absorbing an EUV light.

As described in Configuration 12 above, the reflective mask for EUV lithography of the present invention has a configuration having the substrate with a multilayer reflective film of the present invention, and an absorber film pattern, formed on the Ru protective film in the substrate with a multilayer reflective film, for absorbing an EUV light.

(Configuration 13)

A method of manufacturing a semiconductor device, having a step of forming a transfer pattern on a semiconductor substrate using a reflective mask for EUV lithography obtained by the method of manufacturing a reflective mask for EUV lithography according to Configuration 11 or using the reflective mask for EUV lithography according to Configuration 12.

As described in Configuration 13 above, using a reflective mask for EUV lithography obtained by the method of manufacturing a reflective mask for EUV lithography of the present invention or using the reflective mask for EUV lithography of the present invention, a transfer pattern is formed on a semiconductor substrate, and subjected to other various steps, so that various types of semiconductor devices can be manufactured.

Effect of the Invention

In the present invention, there is provided a substrate with a multilayer reflective film, which gives a reflective mask achieving high reflectance and exhibiting excellent cleaning resistance, and further there are provided a reflective mask blank for EUV lithography manufactured using the above substrate with a multilayer reflective film, for example, a reflective mask for EUV lithography obtained from the mask blank and a method of manufacturing the same, and a method of manufacturing a semiconductor device using the reflective mask.

MODE FOR CARRYING OUT THE INVENTION

Hereinbelow, the present invention will be described in detail. In the present specification, the word "on" as used in the expression, for example, "the second film on the first film" is not used only for indicating a case in which the second film formed on the first film is in contact with the upper surface of the first film, but includes a case in which the second film is formed above the first film and separate from the first film, and is used to have meanings encompassing a case in which a layer is present between the first and second films.

[Substrate with a Multilayer Reflective Film]

Figure 1:
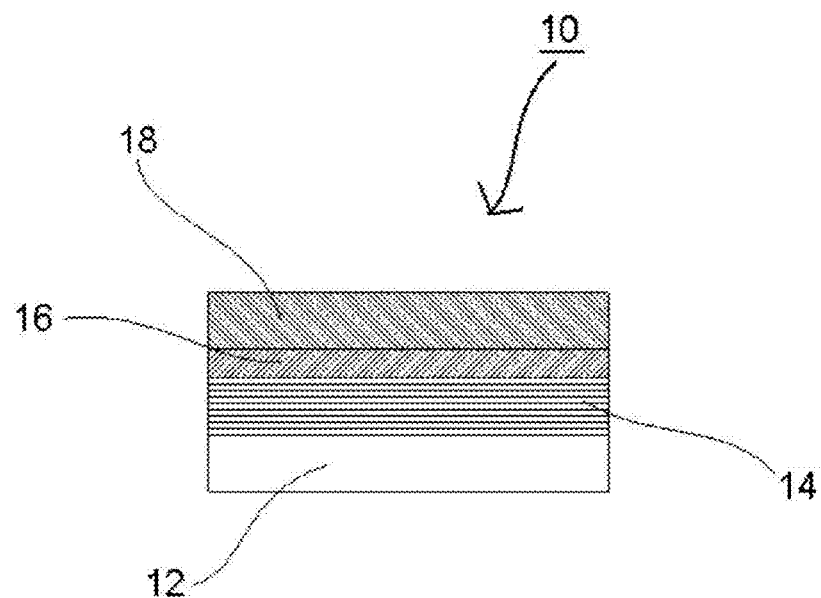
FIG. 1: A schematic diagram showing the cross-section of the substrate with a multilayer reflective film of the present invention.

FIG. 1 is a schematic diagram showing the cross-section of the substrate with a multilayer reflective film of the present invention. A substrate with a multilayer reflective film 10 has a configuration which comprises, on a substrate 12, a multilayer reflective film 14 that reflects EUV light used as exposure light, and a Ru protective film 18, formed on the multilayer reflective film 14 that protects the multilayer reflective film 14, and that further has, between the multilayer reflective film 14 and the Ru protective film 18, a block layer 16 that prevents the diffusion of Si into the Ru protective film 18.

<Substrate 12>

With respect to a substrate 12 used in the substrate with a multilayer reflective film 10 of the present invention, in the case of EUV exposure, for preventing the absorber film pattern from suffering strain due to heat during the exposure, one having a low thermal expansion coefficient in the range of 0±5 ppb/° C. is preferably used. As a material having a low thermal expansion coefficient in the above range, for example, $SiO_2$—$TiO_2$ glass or a multicomponent glass ceramic can be used.

The main surface of the substrate 12 on the side on which a transfer pattern (which the below-described absorber film constitutes) is to be formed has been subjected to surface processing so that the main surface has high flatness from the viewpoint of obtaining at least pattern transfer precision and positional precision. For example, in the case of EUV exposure, in a region of 132 mm×132 mm of the main surface of the substrate 12 on the side on which a transfer pattern is to be formed, the flatness is preferably 0.1 µm or less, further preferably 0.05 µm or less, especially preferably 0.03 µm or less. Further, the main surface on the other side of the surface on which a transfer pattern is to be formed is a surface held by an electrostatic chuck when being set in an exposure machine, and, in a region of 142 mm×142 mm of this main surface, the flatness is 1 µm or less, further preferably 0.5 µm or less, especially preferably 0.03 µm or less. In the present specification, the flatness is a value representing warpage of the surface (deformation) indicated by TIR (Total Indicated Reading), and is an absolute value of a height difference between the highest position of the surface of the substrate present above the focal plane and the lowest position of the surface of the substrate present below the focal plane, wherein the focal plane is a plane determined by a method of least squares using the surface of the substrate as a reference.

In the case of EUV exposure, with respect to the surface smoothness required for the substrate 12, the surface roughness of the main surface of the substrate 12 on which a transfer pattern is to be formed, in terms of a root mean square (RMS) roughness, is preferably 0.1 nm or less. The surface smoothness can be measured by means of an atomic force microscope.

Further, as the substrate 12, for preventing the substrate from suffering deformation due to the film stress of a film (such as a multilayer reflective film 14) which is formed on the substrate, one having a high stiffness is preferred. Particularly, a substrate having a Young's modulus as high as 65 GPa or more is preferred.

<Multilayer Reflective Film 14>

In a substrate with a multilayer reflective film 10 of the present invention, a multilayer reflective film 14 is formed on the above-described substrate 12. The multilayer reflective film 14 imparts a function of reflecting an EUV light to a reflective mask for EUV lithography, and has a configuration of a multilayer film in which layers of elements having different refractive indices are periodically laminated.

Generally, a multilayer film in which a thin film of a light element, which is a high refractive-index material, or a compound thereof (high refractive-index layer) and a thin film of a heavy element, which is a low refractive-index material, or a compound thereof (low refractive-index layer) are alternately laminated in about 40 to 60 cycles of the layers is used as the above-described multilayer reflective film 14. The multilayer film may be one in which a high refractive-index layer/low refractive-index layer laminated structure, which is formed by laminating the high refractive-index layer and the low refractive-index layer in this order from the substrate 12 side, is taken as one cycle and the layers are laminated in multiple cycles, or one in which a low refractive-index layer/high refractive-index layer laminated structure, which is formed by laminating the low refractive-index layer and the high refractive-index layer in this order from the substrate 12 side, is taken as one cycle and the layers are laminated in multiple cycles.

The layer of the top surface of the multilayer reflective film 14, that is, the surface layer of the multilayer reflective film 14 opposite from the substrate 12 is a high refractive-index layer. In the above-described multilayer film, when a high refractive-index layer/low refractive-index layer laminated structure, which is formed by laminating the high refractive-index layer and the low refractive-index layer in this order from the substrate 12 side, is taken as one cycle and the layers are laminated in multiple cycles, the low refractive-index layer constitutes the uppermost layer of the multilayer film. When the low refractive-index layer constitutes the top surface of the multilayer reflective film 14, the low refractive-index layer is easily oxidized to reduce the reflectance of the reflective mask, and therefore the high refractive-index layer is formed on the low refractive-index layer as the uppermost layer of the multilayer film to form the multilayer reflective film 14. Further, in the above-described multilayer film, when a low refractive-index layer/high refractive-index layer laminated structure, which is formed by laminating the low refractive-index layer and the high refractive-index layer in this order from the substrate 12 side, is taken as one cycle and the layers are laminated in multiple cycles, the high refractive-index layer constitutes the uppermost layer of the multilayer film, and therefore, in this case, the high refractive-index layer as the uppermost layer of the multilayer film constitutes the top surface of the multilayer reflective film 14.

In the present invention, as the high refractive-index layer, a layer comprising Si is employed. Examples of materials comprising Si include Si simple substance, and Si compounds comprising Si, and B, C, N, or O. By using the layer comprising Si as a high refractive-index layer, a reflective mask for EUV lithography having excellent reflectance for an EUV light is obtained. Further, in the present invention, a glass substrate is preferably used as the substrate 12, and Si has excellent adhesion to the substrate.

As the above-described low refractive-index material, an element selected from Mo, Ru, Rh, and Pt or an alloy thereof is used. For example, as a multilayer reflective film 14 for an EUV light having a wavelength 13 to 14 nm, a Mo/Si periodically laminated film in which a Mo film and a Si film are alternately laminated in about 40 to 60 cycles is preferably used.

The multilayer reflective film 14 solely has generally a reflectance of 65% or more, and the upper limit of the reflectance is generally 73%. The thickness of the individual layers constituting the multilayer reflective film 14 and the cycle of the layers may be appropriately selected according to the wavelength of exposure light, and is selected so as to satisfy the Bragg's law.

In the multilayer reflective film 14, a plurality of high refractive-index layers and a plurality of low refractive-index layers are present, and the high refractive-index layers may not have the same thickness, and the low refractive-index layers may not have the same thickness. Further, the thickness of the Si layer as the top surface of the multilayer reflective film 14 can be controlled in such a range that the reflectance is not reduced. The thickness of the Si layer as the top surface can be 3 to 10 nm.

The method for forming the multilayer reflective film 14 is known in the related technical field, and the multilayer reflective film can be formed by depositing the individual layers by, for example, an ion beam sputtering method. In the case of the above-described Mo/Si periodic multilayer film, for example, by an ion beam sputtering method, a Si film having a thickness of about 4 nm is first formed on a substrate 12 using a Si target, and then a Mo film having a thickness of about 3 nm is formed using a Mo target, and a series of the formations of the two films is taken as one cycle, and the films are laminated in 40 to 60 cycles to form a multilayer reflective film 14 (wherein the top surface layer is a Si film).

<Block Layer 16>

In a conventional reflective mask, a protective film is formed on the multilayer reflective film, and, to suppress the formation of a diffused layer between the Si layer and the protective film, a protective film comprising a Ru alloy having Zr or B added to Ru has been proposed. However, suppression of the diffusion of Si even by such a Ru protective film is unsatisfactory, and Si diffuses into the Ru protective film and is oxidized to form a silicon oxide (such as $SiO_2$), which causes stripping of the film when being subjected to repeated cleaning during the process for manufacturing a reflective mask, or during use as a finished product. Further, the formation of an intermediate layer or thermal diffusion suppressing film containing Si and O in predetermined amounts between the Mo/Si multilayer reflective film and the Ru protective film has been proposed. However, depending on the material for the intermediate layer or thermal diffusion preventing film, the layer has such unsatisfactory adhesion to the Ru protective film that stripping of the film occurs at the bonded portion.

The fact that Si is oxidized or that the adhesion between a silicon oxide (such as $SiO_2$) and the Ru protective film is unsatisfactory is very difficult to avoid, and therefore, in the present invention, a block layer for preventing the migration of Si to the Ru protective film is employed. Further, the block layer is in a state in which at least part of the Si in the multilayer reflective film is diffused into the block layer.

By virtue of the above configuration, the migration of Si may be inhibited. Thus, Si can be prevented from diffusing into the Ru protective film and coming in contact with gas or a cleaning agent to form a silicon oxide (such as $SiO_2$), which leads to stripping of the film, so that a reflective mask having high reflectance and excellent cleaning resistance can be obtained. Further, by virtue of having the above configuration, there can be obtained a reflective mask which maintains high reflectance even after experiencing any subsequent heat history, and which has excellent cleaning resistance.

The block layer 16 is formed between the multilayer reflective film 14 and the below-described Ru protective film 18. With respect to the constituent material of the block layer 16, there is no particular limitation as long as the material can prevent the migration of Si to the Ru protective film 18, but, as examples of the constituent materials of the block layer, there can be mentioned at least one metal selected from Ti, Al, Ni, Pt, Pd, W, Mo, Co, and Cu and an alloy of the above two or more metals, and a nitride, a silicide, and a silicide nitride thereof. The block layer 16 may comprise either one of these constituent materials or a plurality of materials. The nitride means a nitride of a metal, such as TiN, and a nitride of an alloy, such as TiAlN. Similar meanings apply to the silicide and silicide nitride.

In the present invention, the block layer 16 comprising the above material is formed and then, subjected to heat treatment under temperature conditions such that at least part of the Si in the multilayer reflective film 14 is diffused into layer 16.

The heating causes Si to diffuse into the block layer 16, and a metal simple substance, an alloy, or a compound of the metal or alloy constituting layer 16 and the above Si together form a strong silicide, and therefore, before migrating from the multilayer reflective film 14 to the Ru protective film 18, Si diffuses into the block layer 16 to form a strong silicide in the block layer 16 to be captured.

When such a silicide is formed in the block layer 16, Si cannot pass through the block layer 16 and migrate to the Ru protective film 18, suppressing stripping of the Ru protective film 18. Further, the silicide has excellent adhesion to the Ru protective film 18, as compared to the above-described intermediate layer or thermal diffusion suppressing film containing Si and O in predetermined amounts, and therefore stripping of the Ru protective film due to a lack of the adhesion to the block layer is also suppressed.

From the viewpoint of the formation of a silicide and achieving excellent adhesion to the Ru protective film 18, it is preferred that the block layer 16 comprises at least one member selected from the group consisting of titanium (Ti), a titanium nitride ($TiN_x$ (x>0)), a titanium silicide ($TiSi_x$ (x>0)), and a titanium silicide nitride ($Ti_xSi_yN_z$ (x>0, y>0, z>0)).

Further, with respect to the thickness of the block layer 16, there is no particular limitation as long as heating the layer under the above-described predetermined temperature conditions can form a silicide in such an amount that Si migrating from the multilayer reflective film 14 can be satisfactorily prevented from migrating to the Ru protective film 18. The block layer 16 has a low transmittance for an EUV light, as compared to, e.g., the Ru protective film 18, and hence, when the block layer has too large a thickness, the resultant reflective mask may be lowered in reflectance. Therefore, the block layer 16 preferably has a thickness of 0.2 to 2.0 nm, more preferably 0.5 to 1.5 nm.

The block layer 16 can be formed by various known methods which can form a thin film of a material constituting the block layer, and examples of the methods include an ion beam sputtering method, a sputtering method, a reactive sputtering method, a vapor deposition (CVD) method, and a vacuum vapor deposition method.

The block layer 16 is formed and then, as described above, the resultant substrate is subjected to heat treatment under temperature conditions such that Si in the multilayer reflective film 14 diffuses into the block layer 16. To form a silicide sufficient to prevent Si from migrating from the multilayer reflective film 14 to the Ru protective film 18, in the heat treatment, heating is performed at a temperature higher than the prebake temperature (about 110° C.) for a resist film in the process for manufacturing a reflective mask blank for EUV lithography. Preferably, heating is performed at a temperature higher than the heating (about 50 to 150° C.) for, for example, reducing the film stress of the multilayer reflective film disclosed in Patent Document 4. Specifically, the temperature condition for the heat treatment is generally 160 to 300° C., preferably 180 to 250° C.

The heat treatment step for diffusing Si of the multilayer reflective film 14 into the block layer 16 may be performed before forming the Ru protective film 18 and after forming the block layer 16 on the multilayer reflective film 14, or may be performed before forming an absorber film 20 and after forming the block layer 16 and the Ru protective film 18 on the multilayer reflective film 14.

In the former, there is obtained the substrate with a multilayer reflective film 10 wherein a composition gradient region in which the content of the metal component constituting the block layer 16 continuously decreases toward the substrate 12 is present between the layer comprising Si, which is the surface layer of the multilayer reflective film 14 opposite from the substrate 12, and the block layer 16.

In the latter, there is obtained the substrate with a multilayer reflective film 10 wherein the composition gradient region in the former is present and, in addition, at least part of the metal constituting the block layer 16 is diffused into the Ru protective film 18, and further a composition gradient region in which the content of the metal component constituting the block layer 16 continuously decreases toward the Ru protective film 18 is present between the block layer 16 and the Ru protective film 18.

Before performing the above-described heat treatment, the boundary between the block layer 16 and the multilayer reflective film 14 (in the above latter case, further the boundary between the block layer 16 and the Ru protective film 18) is considered definite, and it is considered that the heat treatment causes the above-described diffusion of Si to form a composition gradient region, so that the above-described boundary becomes indefinite. In both cases in which the heat treatment is performed before or after forming the Ru protective film 18, a strong silicide is formed in the block layer 16 to obtain an effect of improving the cleaning resistance of a reflective mask obtained from the substrate with a multilayer reflective film 10 of the present invention.

<Ru Protective Film 18>

The Ru protective film 18 is formed on the above-formed block layer 16 to protect the multilayer reflective film 14 from dry etching and cleaning in the below-described process for manufacturing a reflective mask for EUV lithography, completing the substrate with a multilayer reflective film 10.

The Ru protective film 18 is comprised of a material containing Ru, and specific examples of the materials constituting the Ru protective film 18 include Ru and alloy materials thereof, and Ru compounds comprising Ru or an alloy thereof and an element, such as N, C, or O. As a Ru alloy, preferred is a Ru compound having Ru and at least one metal element selected from the group consisting of Nb, Zr, Rh, Ti, Co, and Re. Specific examples of such alloys include a RuNb alloy, a RuZr alloy, a RuRh alloy, a RuTi alloy, a RuCo alloy, and a RuRe alloy. The Ru protective film 18 may be of a laminated structure having three layers or more in which the lowermost layer and the uppermost layer are a layer comprised of the above-described material containing Ru and a metal other than Ru or an alloy thereof is present between the lowermost layer and the uppermost layer.

With respect to the thickness of the Ru protective film 18 comprised of Ru or, e.g., an alloy thereof, there is no particular limitation as long as it can function as a protective film, but, from the viewpoint of the transmittance for an EUV light (the entering EUV light passes through the Ru protective film 18 and then is reflected by the multilayer reflective film 14, and the reflected light passes through the Ru protective film 18 to be emitted), the thickness of the Ru protective film is preferably 1.2 to 8.5 nm, more preferably 1.5 to 8 nm, further preferably 1.5 to 6 nm.

Further, from the viewpoint of improving the cleaning resistance of a reflective mask obtained from the substrate with a multilayer reflective film 10, it is preferred that when the above-described Ru protective film 18 is subjected to X-ray diffractometry measurement by an In-Plane measurement method, diffraction peaks appear mainly at (100) and (110), that is, the Ru protective film 18 has an orientation plane mainly at (001) plane.

In the present invention, the expression "diffraction peaks appear mainly at (100) and (110)" means a state in which diffraction peaks appear at (100) and (110) as measured by an In-Plane measurement method for X-ray diffractometry, and there are no other diffraction peaks appearing at, for example, (102), (103), and (112), or the above other diffraction peaks are satisfactorily low. A state in which there are diffraction peaks appearing at, e.g., (102), (103), and (112) in addition to the diffraction peaks appearing at (100) and (110) is defined as random orientation. Further, the state in which "diffraction peaks appear mainly at (100) and (110)" includes a state in which there are high-order diffraction peaks for (100) and (110), such as secondary diffraction peaks {(200), (220)} or tertiary diffraction peaks {(300), (330)}.

When diffraction peaks appear mainly at (100) and (110) as measured for the Ru protective film 18 by an In-Plane method, the particles of the Ru protective film 18 are deposited on the block layer 16 so that the (001) planes of the particles are uniformly arranged along the horizontal direction of the substrate 12. Therefore, the diffusion of Si from the Si layer of the multilayer reflective film 14 and the penetration of a cleaning agent or gas into the Ru protective film 18 are suppressed, so that the reflective mask is further improved in the cleaning resistance. In contrast, in the case of random orientation, the crystal particles of the Ru protective film 18 are deposited on the block layer 16 in a state such that the orientation of the crystal particles is random, and therefore an effect of improving the cleaning resistance due to the orientation of the Ru protective film 18 is unlikely to be obtained.

In the present invention, as a method for forming the Ru protective film 18, one similar to a conventionally known method for forming a protective film can be employed without any particular limitation. Examples of such methods for forming a protective film include a sputtering method and an ion beam sputtering method.

For achieving the Ru protective film 18 in which diffraction peaks appear mainly at (100) and (110) as measured by an In-Plane method as described above, namely, achieving the Ru protective film 18 having an orientation plane mainly at (001) plane, the film is deposited by sputtering so that the angle of incidence of sputtered particles forming the Ru protective film 18 to the normal of the main surface of the substrate 12 is 0 to 45 degrees, preferably 0 to 35 degrees, more preferably 20 to 30 degrees. The Ru protective film 18 is preferably formed by an ion beam sputtering method.

As described above, the substrate with a multilayer reflective film 10 of the present invention has the substrate 12, the multilayer reflective film 14, the block layer 16, and the Ru protective film 18. The substrate with a multilayer reflective film 10 is suppressed in stripping of the Ru protective film 18 by virtue of the block layer 16, and has excellent cleaning resistance while achieving high reflectance, specifically, a reflectance of 63% or more with respect to an EUV light having a wavelength of 13.5 nm.

Further, the substrate with a multilayer reflective film 10 may have a back side conductive film on the main surface of the substrate 12 opposite from the surface on which the multilayer reflective film 14 is formed. The back side conductive film is formed for the purpose of adsorbing the substrate with a multilayer reflective film 10 or a mask blank on an electrostatic chuck used as supporting means for the substrate with a multilayer reflective film 10 when manufacturing a mask blank, or on an electrostatic chuck used as supporting means for mask handling during the pattern process or exposure for the below-described reflective mask blank for EUV lithography of the present invention. The back side conductive film is formed also for the purpose of stress correction of the multilayer reflective film 14.

Further, in the substrate with a multilayer reflective film 10 of the present invention, a base film may be formed between the substrate 12 and the multilayer reflective film 14. The base film is formed for the purpose of improving the smoothness of the surface of the substrate 12, for the purpose of reducing defects, for the purpose of reflection enhancement effect for the multilayer reflective film 14, for the purpose of preventing the charging effect during the electron beam drawing, and for the purpose of stress correction of the multilayer reflective film 14.

Further, the substrate with a multilayer reflective film 10 of the present invention includes an embodiment in which a resist film is formed on the multilayer reflective film 14 or the Ru protective film 18 when a fiducial mark as a reference for the defect position in the substrate 12 or the substrate with a multilayer reflective film 10 is formed by photolithography on the multilayer reflective film 14 or the Ru protective film 18.

[Reflective Mask Blank for EUV Lithography]

Figure 2:
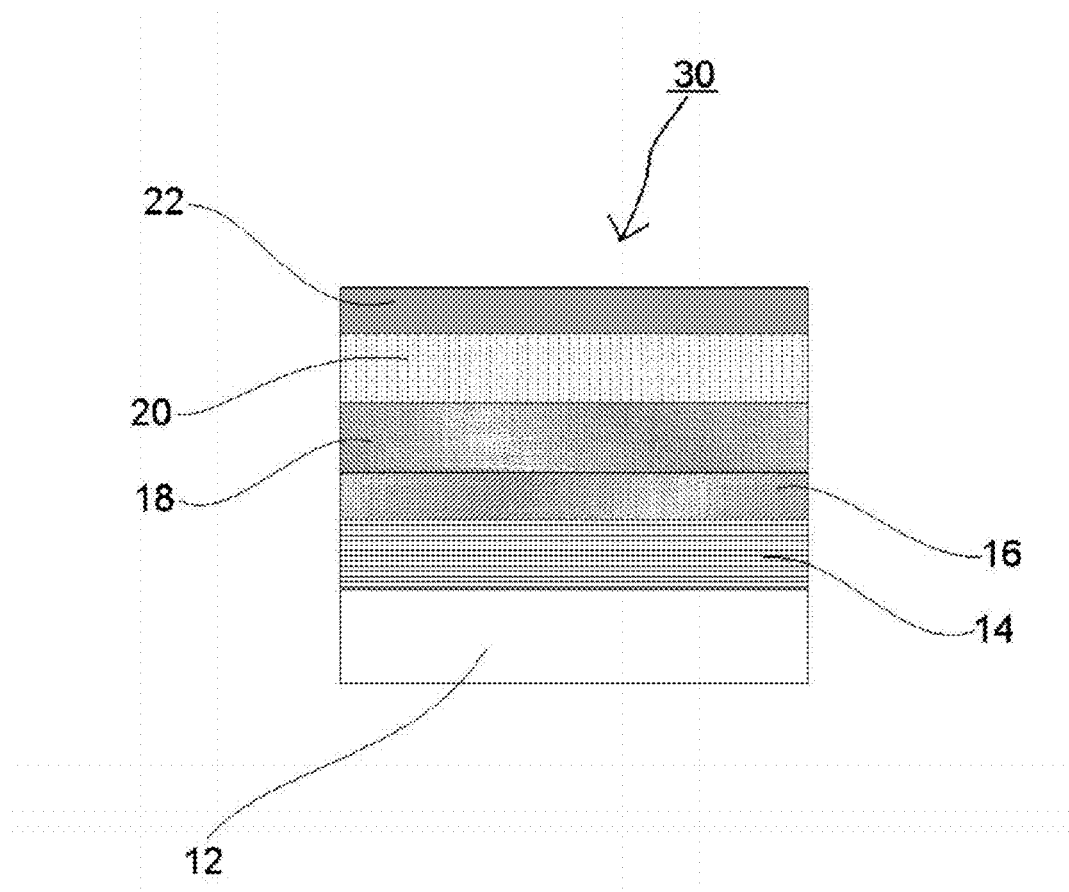
FIG. 2: A schematic diagram showing the cross-section of the reflective mask blank for EUV lithography of the present invention.

FIG. 2 is a schematic diagram showing the cross-section of a reflective mask blank 30 for EUV lithography of the present invention. The mask blank 30 of the present invention can be obtained by forming the absorber film 20 for absorbing an EUV light on the Ru protective film 18 in the above-described substrate with a multilayer reflective film 10 of the present invention.

The absorber film 20 has a function of absorbing an EUV light which is an exposure light, and, in a reflective mask for EUV lithography (the details of which are described below) which is formed using the reflective mask blank 30 for EUV lithography, the absorber film may be one having a desired reflectance difference between the light reflected by the above-described multilayer reflective film 14, the block layer 16, and the Ru protective film 18 and the light reflected by the absorber film pattern.

For example, the reflectance of the absorber film 20 with respect to an EUV light is selected from 0.1 to 40%. In addition to the above-described reflectance difference, a desired phase difference may be present between the light reflected by the multilayer reflective film 14, the block layer 16, and the Ru protective film 18 and the light reflected by the absorber film pattern. When a desired phase difference is present between the above reflected lights, the absorber film 20 in the reflective mask blank 30 for EUV lithography is also called a phase shift film. When a desired phase difference is caused between the above reflected lights to improve the resultant reflective mask in the contrast of reflected light, the phase difference is preferably set to be in the range of 180±10 degrees, and the reflectance of the absorber film is preferably set to be from 3 to 40%.

The above-described absorber film 20 may be of either a single layer or a laminated structure. In the case of a laminated structure, the structure may be either a laminated film of the same material or a laminated film of different materials. The laminated film can be changed in the material or composition stepwise and/or continuously in the thickness direction of the film.

By subjecting the absorber film 20 to dry etching through a resist, a predetermined absorber film pattern is obtained, so that a reflective mask for EUV lithography having portions (the Ru protective film 18 and a portion under the protective film through which the block layer 16 and the multilayer reflective film 14 are exposed) that reflect light (EUV light in the present invention) and a portion (absorber film pattern) that absorbs the light is obtained.

With respect to the material for the absorber film 20, there is no particular limitation as long as the material has a function of absorbing an EUV light and can be removed by, e.g., etching {preferably can be etched by dry etching using chlorine (Cl) or fluorine (F) gas}. As a material having such a function, tantalum (Ta) simple substance or a tantalum compound comprised mainly of Ta can be preferably used.

The absorber film 20 comprising tantalum or a tantalum compound can be formed by a known method, such as a sputtering method, e.g., a DC sputtering method or an RF sputtering method. For example, using a target comprising tantalum and boron, the absorber film 20 can be formed on the Ru protective film 18 by a sputtering method using argon gas having added thereto oxygen or nitrogen.

The tantalum compound is generally an alloy of Ta. With respect to the crystalline state of the absorber film 20, from the viewpoint of the smoothness and flatness, an amorphous or microcrystalline structure is preferred. When the surface of the absorber film 20 is not smooth or flat, the edge roughness of the resultant absorber film pattern is increased, so that the dimensional precision of the pattern may be degraded. The surface roughness of the absorber film 20 is preferably 0.5 nm Rms or less, further preferably 0.4 nm Rms or less, further preferably 0.3 nm Rms or less.

As the above-described tantalum compound, for example, a compound comprising Ta and B, a compound comprising Ta and N, a compound comprising Ta, O, and N, a compound comprising Ta and B and further at least one of O and N, a compound comprising Ta and Si, a compound comprising Ta, Si, and N, a compound comprising Ta and Ge, or a compound comprising Ta, Ge, and N can be used.

Ta is a material which has a large absorption coefficient with respect to an EUV light, and which can be easily dry-etched by chlorine gas or fluorine gas, and hence is an absorber film material having excellent processability. Further, by using Ta having added thereto, e.g., B, Si, or Ge, an amorphous material is easily obtained, making it possible to obtain the absorber film 20 with improved smoothness. By using Ta having added thereto N or O, the absorber film 20 with improved resistance to oxidation is obtained, so that an effect is obtained such that the stability with time can be improved.

In addition, by controlling the temperature of heating the substrate upon forming the absorber film 20 or the sputtering gas pressure upon forming the absorber film, the absorber film material of microcrystalline can be obtained.

Further, as examples of materials constituting the absorber film 20, there can be mentioned, in addition to tantalum and tantalum compounds, materials, such as WN, TiN, and Ti.

The above-described absorber film 20 preferably has an absorption coefficient of 0.025 or more, further preferably 0.030 or more with respect to the wavelength of an exposure light, from the viewpoint of a reduction of the thickness of the absorber film 20.

The thickness of the absorber film 20 may be a thickness that can satisfactorily absorb an EUV light which is an exposure light, but is generally about 30 to 100 nm.

The reflective mask blank 30 for EUV lithography of the present invention includes an embodiment in which a resist film 22 for forming a pattern by dry etching is formed on the above-described absorber film 20.

Further, the reflective mask blank 30 for EUV lithography of the present invention includes an embodiment in which a hard mask film is formed between the above-described absorber film 20 and the resist film 22. The hard mask film has a mask function upon patterning the absorber film 20, and is comprised of a material having an etching selectivity different from that of the absorber film 20. When the absorber film 20 is comprised of tantalum or a tantalum compound, a material, such as chromium or a chromium compound, is selected for the hard mask film. As examples of chromium compounds, there can be mentioned materials comprising Cr and at least one element selected from N, O, C, and H.

In the substrate with a multilayer reflective film 10, on the surface of the substrate 12 on the other side of the surface facing the multilayer reflective film 14, a back side conductive film for the purpose of electrostatic chuck as described above may be formed. The electrical properties required for the back side conductive film are generally 100 Ω/square or less. The method for forming the back side conductive film is known, and the film can be formed by, for example, a magnetron sputtering method or an ion beam sputtering method using a metal, such as chromium (Cr) or tantalum (Ta), or an alloy thereof as a target. With respect to the thickness of the back side conductive film, there is no particular limitation as long as the above-described purpose is achieved, but the thickness is generally 10 to 200 nm.

As described below, the reflective mask blank 30 for EUV lithography of the present invention is further processed to obtain a reflective mask for EUV lithography, and, with respect to the obtained reflective mask, generally, an inspection for pattern and correction are performed. In the case of a reflective mask using an EUV light as an exposure light, as an inspection light used in the inspection for pattern, a light having a long wavelength, as compared to an EUV light having a wavelength of, for example, 193 nm or 257 nm, is often used. For dealing with an inspection light having a long wavelength, it is necessary to reduce reflection of the light off the surface of the absorber film 20. In this case, the absorber film 20 advantageously has a configuration in which an absorber layer having mainly a function of absorbing an EUV light and a low reflective layer having mainly a function of reducing reflection of the inspection light off the surface are laminated from the substrate 12 side. When the absorber layer is formed from a material comprised mainly of Ta, a material having O added to Ta or TaB is preferred as the low reflective layer.

[Reflective Mask for EUV Lithography]

Using the above-described reflective mask blank 30 for EUV lithography of the present invention, the reflective mask for EUV lithography of the present invention can be manufactured. In manufacturing the reflective mask for EUV lithography of the present invention, a photolithography method that enables high-definition patterning is most preferred.

Hereinbelow, a method utilizing a photolithography method is described in which the absorber film 20 in the reflective mask blank 30 for EUV lithography is patterned with a resist film to manufacture the reflective mask for EUV lithography of the present invention. A schematic diagram of the method is shown in FIGS. 3A, 3B, 3C, 3D, and 3E. In FIGS. 3A, 3B, 3C, 3D, and 3E, with respect to the same parts, only one part is indicated by a reference numeral, and indication of the reference numeral for the other same parts is omitted.

Figure 3:
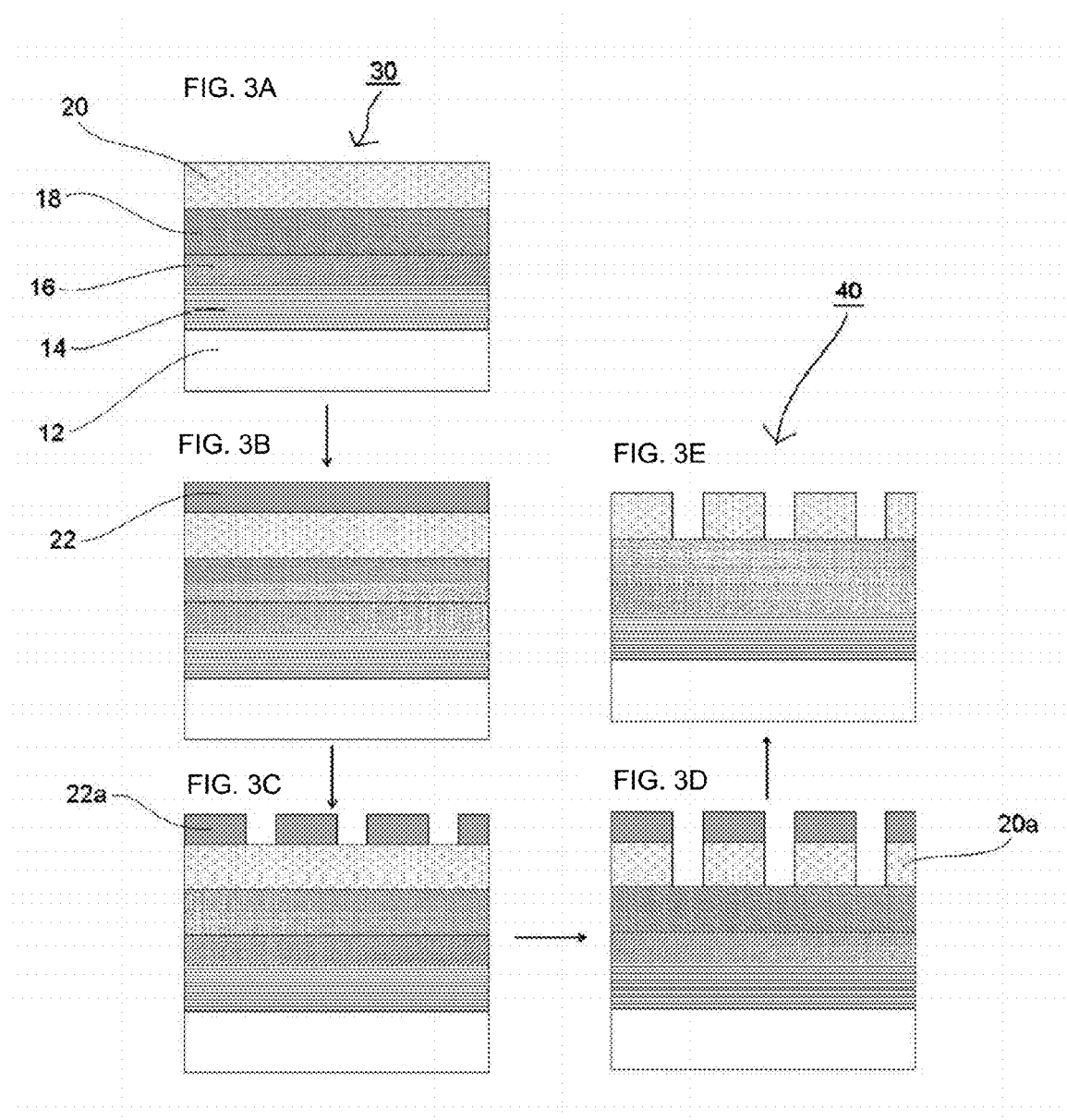
FIGS. 3A, 3B, 3C, 3D, and 3E: A schematic diagram showing the method of manufacturing a reflective mask for EUV lithography of the present invention.

First, in mask blank 30 in which the substrate 12, the multilayer reflective film 14, the block layer 16, the Ru protective film 18, and the absorber film 20 are formed in this order {FIG. 3A}, the resist film 22 is formed on the absorber film 20 {FIG. 3B}. A mask blank in which the resist film 22 has already been formed is also the reflective mask blank 30 for EUV lithography of the present invention, and therefore the method may be started from such a mask blank. A desired pattern is drawn in the resist film 22 (exposure), and further subjected to development and rinsing to form a predetermined resist pattern 22a {FIG. 3C}.

Using the formed resist pattern 22a as a mask, dry etching using etching gas is conducted to etch a portion of the absorber film 20 which is not covered with the resist pattern 22a, forming an absorber film pattern 20a on the Ru protective film 18 {FIG. 3D}.

Examples of the etching gases include chlorine gas, such as $Cl_2$, $SiCl_4$, $CHCl_3$, and $CCl_4$, a mixed gas containing a chlorine gas and $O_2$ in a predetermined ratio, a mixed gas containing a chlorine gas and He in a predetermined ratio, a mixed gas containing a chlorine gas and Ar in a predetermined ratio, fluorine gas, such as $CF_4$, $CHF_3$, $C_2F_6$, $C_3F_6$, $C_4F_6$, $C_4F_8$, $CH_2F_2$, $CH_3F$, $C_3F$, $SF_6$, and F, a mixed gas containing a fluorine gas and $O_2$ in a predetermined ratio, a mixed gas containing a fluorine gas and He in a predetermined ratio, and a mixed gas containing a fluorine gas and Ar in a predetermined ratio.

Then, the resist pattern 22a is removed using, for example, a resist stripping agent, followed by wet cleaning using an acid or alkaline aqueous solution, obtaining a reflective mask 40 for EUV lithography achieving high reflectance {FIG. 3E}.

[Method of Manufacturing a Semiconductor Device]

By a lithography technique using the above-described reflective mask 40 for EUV lithography of the present invention, a transfer pattern based on the absorber film pattern 20a in the above-described mask is formed on a semiconductor substrate, and subjected to other various steps, so that a semiconductor device having, e.g., various patterns formed on the semiconductor substrate can be manufactured.

Figure 4:
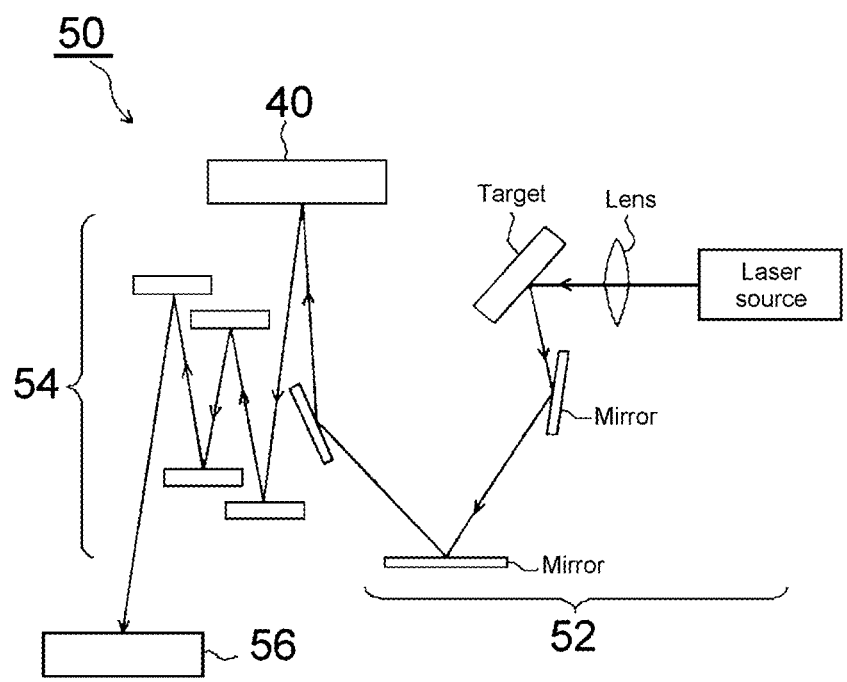
FIG. 4: A schematic diagram showing the step of transferring a pattern to a semiconductor substrate with a resist by a pattern transfer apparatus.

As a more specific example, a method for transferring a pattern to a semiconductor substrate 56 with a resist by means of a pattern transfer apparatus 50 shown in FIG. 4 by an EUV light using the reflective mask 40 for EUV lithography is described.

The reflective mask 50 having mounted thereon the reflective mask 40 for EUV lithography substantially comprises a laser plasma X-ray source 52, the reflective mask 40, and a reduction optical system 54. As the reduction optical system 54, an X-ray reflecting mirror is used.

By the reduction optical system 54, the pattern reflected by the reflective mask 40 is reduced generally to about ¼. For example, using a wavelength in the range of 13 to 14 nm as an exposure wavelength, the system is preliminarily set so that the optical path is in a vacuum. In such a condition, an EUV light obtained from the laser plasma X-ray source 52 is allowed to strike the reflective mask 40, and the light reflected by the mask is passed through the reduction optical system 54 and transferred to a semiconductor substrate 56 with a resist.

The light striking the reflective mask 40 is absorbed by the absorber film at portions having the absorber film pattern 20a and is not reflected (or is reflected to a certain extent when the absorber film is the above-described phase shift film), and, on the other hand, the light striking portions having no absorber film pattern 20a is reflected by the multilayer reflective film 14. Thus, an image formed from the light reflected by the reflective mask 40 enters the reduction optical system 54. The exposure light which has passed through the reduction optical system 54 forms a transfer pattern on the resist layer on a semiconductor substrate 56 with a resist. Then, the exposed resist layer is developed, so that a resist pattern can be formed on the semiconductor substrate 56 with a resist.

Then, by performing, for example, etching using the above resist pattern as a mask, a predetermined interconnection pattern can be formed on, for example, a semiconductor substrate.

A semiconductor device is manufactured through the above steps and other required steps.

EXAMPLES

Hereinbelow, the present invention will be described in more detail with reference to the following Examples, which should not be construed as limiting the scope of the present invention.

Reference Example 1

<Manufacture of a Substrate with a Multilayer Reflective Film>

The substrate to be used is a $SiO_2$—$TiO_2$ glass substrate (which is 6 inches square and has a thickness of 6.35 mm). The edge face of the glass substrate was subjected to beveling and grinding processing, and further subjected to rough polishing treatment using a polishing agent containing cerium oxide abrasive particles. The thus treated glass substrate was set in a carrier of a double-side polishing apparatus, and subjected to precision polishing under predetermined polishing conditions using an alkaline aqueous solution containing colloidal silica abrasive particles as a polishing agent. After completion of the precision polishing, the resultant glass substrate was subjected to cleaning treatment.

Thus, a glass substrate for a reflective mask blank for EUV lithography was prepared. With respect to the main surface of the obtained glass substrate, the surface roughness in terms of a root mean square (RMS) roughness as excellent as 0.10 nm or less. Further, the flatness in a measurement region of 132 mm×132 mm was as excellent as 30 nm or less.

Then, on the back side of the glass substrate for reflective mask blank for EUV lithography, a back side conductive film comprising CrN was formed by a magnetron sputtering method under the conditions shown below.

Conditions for forming a back side conductive film: Cr target; Ar+$N_2$ gas atmosphere (Ar:$N_2$=90%:10%); film composition (Cr:90 at %; N:10%); film thickness: 20 nm.

Then, on the main surface of the glass substrate for reflective mask blank for EUV lithography opposite from the surface on which the back side conductive film is formed, a multilayer reflective film was formed as described below. As a multilayer reflective film formed on the glass substrate, for forming a multilayer reflective film suitable for an exposure light in a wavelength range of 13 to 14 nm, a Mo film/Si film periodic multilayer reflective film was employed.

That is, a multilayer reflective film was formed by alternately laminating a Mo layer and a Si layer on the substrate by ion beam sputtering (using Ar) using a Mo target and a Si target.

A Si film having a thickness of 4.2 nm was first formed, and then a Mo film having a thickness of 2.8 nm was formed. A series of the formations of these two films was taken as one cycle, and the films were similarly laminated in 40 cycles, and a Si film having a thickness of 4.0 nm was finally deposited to form a multilayer reflective film.

Subsequently, a metal layer comprising Ti having a thickness of 1.0 nm was formed on the above-described multilayer reflective film similarly by ion beam sputtering (using Ar) using a Ti target, and further a Ru protective film having a thickness of 1.5 nm was formed on the metal layer by ion beam sputtering (using Ar) using a Ru target.

In the thus obtained substrate with a multilayer reflective film, the reflectance of the surface of the Ru protective film with respect to an EUV light having a wavelength of 13.5 nm was as high as 63.50%.

<Manufacture of a Reflective Mask Blank for EUV Lithography>

On the Ru protective film of the above-obtained substrate with a multilayer reflective film was formed an absorber film comprising a laminated film of TaBN (thickness: 56 nm) and TaBO (thickness: 14 nm) by a DC sputtering method to manufacture a reflective mask blank for EUV lithography.

Reference Example 2

<Manufacture of a Substrate with a Multilayer Reflective Film>

A substrate with a multilayer reflective film was manufactured in substantially the same manner as in Reference Example 1 except that the metal layer was changed to a TiN layer having a thickness of 1.0 nm. The TiN layer was formed by ion beam sputtering using a Ti target and Ar+$N_2$ mixed gas. In the obtained substrate with a multilayer reflective film, the reflectance of the surface of the Ru protective film with respect to an EUV light having a wavelength of 13.5 nm was as high as 63.20%.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC sputtering in the same manner as in Reference Example 1 to manufacture a reflective mask blank for EUV lithography.

Example 1

<Manufacture of a Substrate with a Multilayer Reflective Film>

A substrate with a multilayer reflective film was manufactured in the same manner as in Reference Example 1. The metal layer was deposited and formed by ion beam sputtering (using Ar) using a Ti target, and then subjected to annealing (heating in a vacuum at 200° C. for one hour) so that Si in the Si layer as the top surface of the multilayer reflective film is diffused into the metal layer to form a block layer. The diffusion of Si forms titanium silicide in the block layer.

Further, a Ru protective film was formed on the block layer by ion beam sputtering to manufacture a substrate with a multilayer reflective film. The above-described Ru protective film was formed by depositing Ru particles at an angle of 30 degrees to the normal of the main surface of the glass substrate.

In the obtained substrate with a multilayer reflective film, the reflectance of the surface of the Ru protective film with respect to an EUV light having a wavelength of 13.5 nm was as high as 63.65%.

With respect to the Ru protective film in the substrate with a multilayer reflective film, an X-ray diffractometry measurement was conducted by an In-Plane measurement method, and, as a result, only diffraction peaks appearing at (100), (110), and (200) were observed, and the film was found to have an orientation plane mainly at (001) plane. Further, a compositional analysis in the film depth direction of the substrate with a multilayer reflective film was conducted by X-ray photoelectron spectroscopy (XPS). The results have confirmed that a gradient region in which the content of the titanium component constituting the block layer continuously decreases toward the glass substrate is present between the Si layer, which is the top surface layer of the multilayer reflective film, and the block layer comprised of titanium silicide.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC sputtering in the same manner as in Reference Example 1 to manufacture a reflective mask blank for EUV lithography.

Example 2

<Manufacture of a Substrate with a Multilayer Reflective Film>

A substrate with a multilayer reflective film was manufactured in the same manner as in Reference Example 2. The TiN layer was deposited and formed by the same method as that in Reference Example 2, and then subjected to annealing (heating in a vacuum at 200° C. for one hour) so that Si in the Si layer as the top surface of the multilayer reflective film diffuses into the TiN layer to form a block layer. The diffusion of Si forms nitrided titanium silicide in the block layer.

Further, a Ru protective film was formed on the block layer by ion beam sputtering to manufacture a substrate with a multilayer reflective film. The Ru protective film was formed by depositing Ru particles at an angle of 30 degrees to the normal of the main surface of the glass substrate.

In the obtained substrate with a multilayer reflective film, the reflectance of the surface of the Ru protective film with respect to an EUV light having a wavelength of 13.5 nm was as high as 63.35%.

With respect to the Ru protective film in the substrate with a multilayer reflective film, an X-ray diffractometry measurement was conducted by an In-Plane measurement method, and, as a result, only diffraction peaks appearing at (100), (110), and (200) were observed, and the film was found to have an orientation plane mainly at (001) plane. Further, a compositional analysis in the film depth direction of the substrate with a multilayer reflective film was conducted by X-ray photoelectron spectroscopy (XPS). The results have confirmed that a gradient region in which the content of the titanium component constituting the block layer continuously decreases toward the glass substrate is present between the Si layer, which is the top surface layer of the multilayer reflective film, and the block layer comprised of nitrided titanium silicide.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC sputtering in the same manner as in Reference Example 1 to manufacture a reflective mask blank for EUV lithography.

Example 3

<Manufacture of a Substrate with a Multilayer Reflective Film>

A substrate with a multilayer reflective film was manufactured in the same manner as in Reference Example 1. The metal layer was deposited and formed by ion beam sputtering (using Ar) using a Ti target, and a Ru protective film was formed on the metal layer, and then subjected to annealing (heating in air at 200° C. for one hour) so that Si in the Si layer as the top surface of the multilayer reflective film had diffused into the metal layer to form a block layer. The diffusion of Si forms titanium silicide in the block layer.

In the obtained substrate with a multilayer reflective film, the reflectance of the surface of the Ru protective film with respect to an EUV light having a wavelength of 13.5 nm was as high as 63.70%.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC sputtering in the same manner as in Reference Example 1 to manufacture a reflective mask blank for EUV lithography.

Example 4

<Manufacture of a Substrate with a Multilayer Reflective Film>

A substrate with a multilayer reflective film was manufactured in the same manner as in Reference Example 2. The TiN layer was deposited and formed by the same method as that in Reference Example 2, and a Ru protective film was formed on the TiN layer, and then subjected to annealing (heating in air at 200° C. for one hour) so that Si in the Si layer as the top surface of the multilayer reflective film is diffused into the TiN layer to form a block layer. The diffusion of Si forms nitrided titanium silicide in the block layer.

In the obtained substrate with a multilayer reflective film, the reflectance of the surface of the Ru protective film with respect to an EUV light having a wavelength of 13.5 nm was as high as 63.40%.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC sputtering in the same manner as in Reference Example 1 to manufacture a reflective mask blank for EUV lithography.

Example 5

<Manufacture of a Substrate with a Multilayer Reflective Film>

A substrate with a multilayer reflective film was manufactured in the same manner as in Example 3. The metal layer was deposited and formed by ion beam sputtering (using Ar) using a Ti target, and a Ru protective film was formed on the metal layer, and then subjected to annealing (heating in a vacuum at 200° C. for one hour) so that Si in the Si layer as the top surface of the multilayer reflective film is diffused into the metal layer to form a block layer. The Ru protective film was formed by depositing Ru particles at an angle of 30 degrees to the normal of the main surface of the glass substrate.

In the obtained substrate with a multilayer reflective film, the reflectance of the surface of the Ru protective film with respect to an EUV light having a wavelength of 13.5 nm was as high as 63.85%.

With respect to the Ru protective film in the substrate with a multilayer reflective film, an X-ray diffractometry measurement was conducted by an In-Plane measurement method, and, as a result, only diffraction peaks appearing at (100), (110), and (200) were observed, and the film was found to have an orientation plane mainly at (001) plane. Further, a compositional analysis in the film depth direction of the substrate with a multilayer reflective film was conducted by X-ray photoelectron spectroscopy (XPS). The results confirmed that a gradient region in which the content of the titanium component constituting the block layer continuously decreases toward the glass substrate is present between the Si layer, which is the top surface layer of the multilayer reflective film, and the block layer, and that further a gradient region in which the content of the titanium component constituting the block layer continuously decreases toward the Ru protective film is present between the block layer and the Ru protective film.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC sputtering in the same manner as in Reference Example 1 to manufacture a reflective mask blank for EUV lithography.

Example 6 to Example 11

Substrates with a multilayer reflective film were individually manufactured in substantially the same manner as in Example 5 except that the metal layer was changed to an Al layer (Example 6), a Ni layer (Example 7), a Pd layer (Example 8), a W layer (Example 9), a Co layer (Example 10), or a Cu layer (Example 11), each having a thickness of 1.0 nm.

In the obtained substrates with a multilayer reflective film, the reflectance of the surface of the Ru protective film with respect to an EUV light having a wavelength of 13.5 nm was as high as in the range of from 62.00 to 63.65%.

With respect to the Ru protective film in the substrate with a multilayer reflective film, an X-ray diffractometry measurement was conducted by an In-Plane measurement method, and, as a result, in all of the Examples, only diffraction peaks appearing at (100), (110), and (200) were observed, and the films were found to have an orientation plane mainly at (001) plane. Further, a compositional analysis in the film depth direction of the substrate with a multilayer reflective film was conducted by X-ray photoelectron spectroscopy (XPS). The results have confirmed that a gradient region in which the content of the metal component (Al, Ni, Pd, W, Co, or Cu) constituting the block layer continually decreases toward the glass substrate is present between the Si layer, which is the top surface layer of the multilayer reflective film, and the block layer, and that further a gradient region in which the content of the metal component (Al, Ni, Pd, W, Co, or Cu) constituting the block layer continually decreases toward the Ru protective film is present between the block layer and the Ru protective film.

<Manufacture of a Reflective Mask Blank for EUV Lithography>

Using each of the above-obtained substrates with a multilayer reflective film, an absorber film comprising a laminated film of TaBN (thickness: 56 nm) and TaBO (thickness: 14 nm) was formed on the Ru protective film by ion beam sputtering (using Ar) in the same manner as in Reference Example 1 to manufacture a reflective mask blank for EUV lithography.

Comparative Example 1

<Manufacture of a Substrate with a Multilayer Reflective Film>

A substrate with a multilayer reflective film was manufactured in substantially the same manner as in Reference Example 1 except that the metal layer was not formed. The Ru protective film had a thickness of 2.5 nm. In the obtained substrate with a multilayer reflective film, the reflectance of the surface of the Ru protective film with respect to an EUV light having a wavelength of 13.5 nm was as high as 64%.

<Manufacture of a Reflective Mask Blank for EUV Lithography>

Using the above-obtained substrate with a multilayer reflective film, an absorber film comprising a laminated film of TaBN (thickness: 56 nm) and TaBO (thickness: 14 nm) was formed on the Ru protective film by DC sputtering in the same manner as in Reference Example 1 to manufacture a reflective mask blank for EUV lithography.

[Mask Cleaning Resistance Test]

Using each of the reflective mask blanks for EUV lithography obtained in Reference Examples 1 and 2, Examples 1 to 11, and Comparative Example 1 above, a reflective mask for EUV lithography was manufactured. Specifically, the procedure is as follows.

First, a resist film for electron beam drawing was formed on the absorber film of the reflective mask blank, and a predetermined pattern was drawn using an electron beam drawing machine. After the drawing, a predetermined development treatment was conducted to form a resist pattern on the absorber film.

Then, using the above-formed resist pattern as a mask, the TaBO film as the upper layer was subjected to dry etching by fluorine gas ($CF_4$ gas) and the TaBN film as the lower layer was subjected to dry etching by chlorine gas ($Cl_2$ gas) to form a transfer pattern in the absorber film, forming an absorber film pattern.

Further, the resist pattern remaining on the absorber film pattern was removed using hot sulfuric acid to obtain a reflective mask. Thus, from each of the reflective mask blanks in Reference Examples 1 and 2, Examples 1 to 11, and Comparative Example 1, 20 reflective masks were formed.

<RCA Cleaning Evaluation 1>

With respect to the obtained reflective mask, general RCA cleaning was repeated 100 times to evaluate the cleaning resistance of the reflective mask.

As a result, in each of the reflective masks in Reference Examples 1 and 2 and Examples 1 to 11, no stripping was observed in the Ru protective film exposed surface after the 100-time RCA cleaning, which indicates that these reflective masks have excellent cleaning resistance. In contrast, in the reflective mask in Comparative Example 1, the 5- to 10-time cleaning caused stripping of the film, which indicates that the cleaning resistance is poor, as compared to those in the Reference Examples and Examples. The state of stripping of a film was examined by means of a SEM (scanning electron microscope).

<RCA Cleaning Evaluation 2>

Further, with respect to the reflective masks in Reference Examples 1 and 2 and Examples 1 to 11, the above-described RCA cleaning was repeated 150 times to evaluate the cleaning resistance of the reflective mask. As a result, in the reflective masks in Reference Examples 1 and 2, no stripping was observed in the Ru protective film exposed surface after the 100-time RCA cleaning. In the reflective masks in Examples 1 and 2, no stripping was observed in the Ru protective film exposed surface after the 120-time RCA cleaning, which indicates that these reflective masks have excellent cleaning resistance, as compared to those in the Reference Examples. Further, in each of the reflective masks in Examples 3 to 11, no stripping was observed in the Ru protective film exposed surface after the 150-time RCA cleaning, which indicates that these reflective masks have especially excellent cleaning resistance.

DESCRIPTION OF REFERENCE NUMERALS

10: Substrate with a multilayer reflective film
12: Substrate
14: Multilayer reflective film
16: Block layer
18: Ru protective film
20: Absorber film
20a: Absorber film pattern
22: Resist film
22a: Resist pattern
30: Reflective mask blank for EUV lithography
40: Reflective mask for EUV lithography
50: Pattern transfer apparatus
52: Laser plasma X-ray source
54: Reduction optical system
56: Semiconductor substrate with a resist

The invention claimed is:

1. A substrate with a multilayer reflective film, comprising:
    a substrate,
    a multilayer reflective film, formed on the substrate, comprising a layer that includes Si as a high refractive-index material and a layer that include a low refractive-index material, the layers being periodically laminated,
    a Ru protective film, formed on the multilayer reflective film, for protecting the multilayer reflective film, and
    a block layer, formed between the multilayer reflective film and the Ru protective film, for preventing the migration of Si to the Ru protective film,
    wherein the surface layer on the other side of the multilayer reflective film opposite from the substrate is the layer comprising Si, and at least part of the Si is diffused into the block layer.

2. The substrate with a multilayer reflective film according to claim 1, wherein the block layer comprises at least one member selected from the group consisting of at least one metal selected from Ti, Al, Ni, Pt, Pd, W, Mo, Co, and Cu, an alloy of the above two or more metals, and a nitride, a silicide, and a silicide nitride thereof.

3. The substrate with a multilayer reflective film according to claim 2, wherein a gradient region in which the content of the metal component constituting the block layer continually decreases toward the substrate is present between the layer comprising Si, which is the surface layer on the other side of the multilayer reflective film opposite from the substrate, and the block layer.

4. The substrate with a multilayer reflective film according to claim 1, wherein the low refractive-index material is Mo.

5. The substrate with a multilayer reflective film according to claim 1, wherein the block layer has a thickness of 0.2 to 2.0 nm.

6. The substrate with a multilayer reflective film according to claim 1, wherein the block layer comprises at least one member selected from the group consisting of titanium (Ti), a titanium nitride ($TiN_x$ (x>0)), a titanium silicide ($TiSi_x$ (x>0)), and a titanium silicide nitride ($Ti_xSi_yN_z$ (x>0, y>0, z>0)).

7. A reflective mask blank for EUV lithography, comprising the substrate with a multilayer reflective film according to claim 1, and an absorber film, formed on the Ru protective film in the substrate with a multilayer reflective film, for absorbing an EUV light.

8. The reflective mask blank for EUV lithography according to claim 7, further comprising a resist film on the absorber film.

9. A method of manufacturing a reflective mask for EUV lithography, the method comprising a step of patterning an absorber film in the reflective mask blank for EUV lithography according to claim 8 with the resist film to form an absorber film pattern on the Ru protective film.

10. A method of manufacturing a semiconductor device, the method comprising a step of forming a transfer pattern on a semiconductor substrate using a reflective mask for EUV lithography obtained by the method of manufacturing a reflective mask for EUV lithography according to claim 9.

11. A reflective mask for EUV lithography, the reflective mask comprising the substrate with a multilayer reflective film according to claim 1, and an absorber film pattern, formed on the Ru protective film in the substrate with a multilayer reflective film, for absorbing an EUV light.

12. A method of manufacturing a semiconductor device, the method comprising a step of forming a transfer pattern on a semiconductor substrate using the reflective mask for EUV lithography according to claim 11.

13. A method of manufacturing a substrate with a multilayer reflective film, which has: a substrate; a multilayer reflective film, formed on the substrate, comprising a layer that includes Si as a high refractive-index material and a layer that include a low refractive-index material, the layers being periodically laminated; a Ru protective film, formed on the multilayer reflective film, for protecting the multilayer reflective film; and a block layer, formed between the multilayer reflective film and the Ru protective film, for preventing the migration of Si to the Ru protective film, wherein the surface layer on the other side of the multilayer reflective film opposite from the substrate is the layer comprising Si, and at least part of the Si is diffused into the block layer,
    the method comprising:
    forming the multilayer reflective film on the substrate;
    forming, on the layer comprising Si, which is the surface layer on the other side of the multilayer reflective film opposite from the substrate, a block layer for preventing the migration of Si to the Ru protective film; and
    forming the Ru protective film on the block layer,
    the method further having the step of, after forming the block layer, subjecting the resultant substrate to heat treatment under temperature conditions wherein at least part of the Si in the multilayer reflective film is diffused into the block layer.

14. A method of manufacturing a reflective mask blank for EUV lithography, comprising a step of forming an absorber film on the Ru protective film in the substrate with a multilayer reflective film obtained by the method of manufacturing the substrate with a multilayer reflective film according to claim 13.

* * * * *